United States Patent [19]

Buschow

[11] Patent Number: 4,889,607

[45] Date of Patent: Dec. 26, 1989

[54] METHOD OF PRODUCING THE MAGNETIC METALLIC LAYERS HAVING A LOW THERMAL COEFFICIENT OF EXPANSION

[75] Inventor: Kurt H. J. Buschow, Eindhoven, Netherlands

[73] Assignee: U.S. Philips Corporation, New York, N.Y.

[21] Appl. No.: 239,739

[22] Filed: Sep. 2, 1988

[30] Foreign Application Priority Data

Sep. 14, 1987 [NL] Netherlands .......................... 8702180

[51] Int. Cl.$^4$ .............................................. C23C 14/34
[52] U.S. Cl. ............................ 204/192.15; 204/192.2; 204/192.23
[58] Field of Search ....................... 204/192.12, 192.22, 204/192.23, 192.15, 192.2; 427/128

[56] References Cited

U.S. PATENT DOCUMENTS

| | | | |
|---|---|---|---|
| 4,576,699 | 3/1986 | Sato et al. | 204/192.2 X |
| 4,608,142 | 8/1986 | Gomi et al. | 204/192.2 |
| 4,684,454 | 8/1987 | Gardner | 204/192.2 |

*Primary Examiner*—Nam X. Nguyen
*Attorney, Agent, or Firm*—Norman N. Spain

[57] ABSTRACT

A method of producing thin magnetic layers is described. The material composition is defined by the formula $REFe_{12-x}T_x$, wherein RE is an element chosen from the set formed by Nd, Sm, Gd, Tb, Dy, Ho, Er, Tm, Lu and Y, wherein T is an element chosen from the set formed by Si, Ti, V, Cr, Mo and W, and wherein $1 \leq x \leq 4$. This material is applied by means of a deposition technique from the vapor phase.

3 Claims, 1 Drawing Sheet

METHOD OF PRODUCING THE MAGNETIC METALLIC LAYERS HAVING A LOW THERMAL COEFFICIENT OF EXPANSION

BACKGROUND OF THE INVENTION

The invention relates to a method of producing thin magnetic, metallic layers having a low thermal coefficient of expansion on a substrate.

Such magnetic metallic layers are used in applications where a low expansion in a wide temperature range is required.

A method of producing magnetic metallic compounds having a low coefficient of expansion is disclosed in inter alia European Patent Specification 118,148. This patent describes a method which is suitable for producing objects of magnetic ternary allows on an iron base. These alloys have the nomimal composition La(Fe, Co, X)$_{13}$, wherein X is chosen from the group consisting of the elements Al and Si. Said alloys are formed by an intermetallic compound having a crystal structure of the NaZn$_{13}$-type. These intermetallic compounds have a low thermal coefficient of expansion in the temperature range from 0°–200° C.

Further experiments with these compounds showed that at an appropriate choice of a mixture of at least two of these compounds the thermal coefficient of expansion of the mixed compound is less than the coefficient of expansion of the individual compounds.

In practice it has been found that producing thin magnetic or metallic layers of mixed compounds of the said La(Fe, Co, X)$_{13}$-alloys is not without disadvantages.

SUMMARY OF THE INVENTION

It is an object of the invention to provide a method of producing thin, magnetic, metallic layers having a low coefficient of expansion which does not have said disadvantages.

This object is accomplished by means of a method which is characterized in that the magnetic, metallic material the composition of which is defined by the formula REFe$_{12-x}$T$_x$, wherein RE is an element selected from the group consisting of Nd, Sm, Gd, Tb, Dy, Ho, Er, Tm, Lu and Y, wherein T is an element chosen from the set formed by Si, Ti, V, Cr, Mo and W, and wherein $1 \leq x \leq 4$ is applied by means of a deposition technique from the vapour phase.

From experiments it appeared that the said REFe$_{12-x}$T$_x$-compounds have a low thermal coefficient of expansion in the temperature range from 0°–200° C. The Curie point of the compounds vary from 350–600 K. Because of this relatively high Curie point no expensive Co needs to be added the compound.

The highly ferro-magnetic behaviour of the compounds is determined by Fe and the RE-element chosen, more specifically by the coupling of the magnetic moments of these elements. Said compounds have a hard-magnetic, stable, intermetallic component with a tetragonal crystal structure of the ThMn$_{12}$-type. This hard-magnetic component is obtained because of the presence of the elements T, which stabilizes the intermetallic structure.

It was further found that when x is less than 1 or larger than 4, said magnetic intermetallic component is not present in the compound to a sufficient extent, so that the magnetic properties of the compound significantly decrease.

It was further found that, in contradistinction to the said mixed compounds of the La(Re, Co, X)$_{13}$-type, REFe$_{12-x}$T$_x$-compounds can be applied in thin layers on a substrate by means of a deposition technique from the vapour phase.

In accordance with a further preferred embodiment the method is characterized in that the magnetic, metallic material is deposited by means of a sputtering procedure. Starting point of this procedure is a casting which has the composition of the thin magnetic layer to be realized. Consequently, this procedure is simpler than a procedure in which the elements are separately brought to the vapour phase and thereafter vacuum-deposited in a thin layer.

A further preferred embodiment of the method is characterized in that during the deposition procedure the substrate is heated to over 600° C. It has been found that the thin magnetic layer crystallizes in these circumstances to an improved extent on the substrate.

Figure 1:
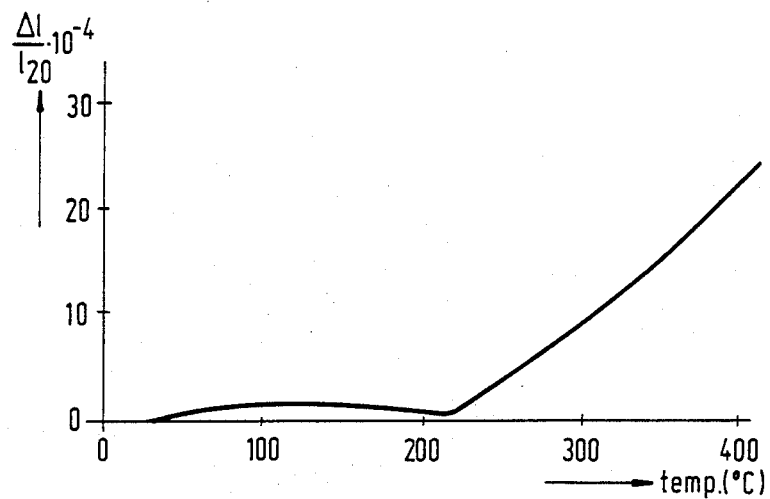
FIG. 1 is a graph showing the expansion of LuFe$_{10}$V$_2$ as a function of temperature, A preferred embodiment of the method is characterized in that the composition of the magnetic material is defined by the formula REFe$_{10}$V$_2$, wherein RE is an element chosen from the set formed by Nd, Sm, Gd, Tb, Dy, Ho, Er, Tm, Lu and Y. Experiments showed that in the temperature range from 0°–200° C. the thermal coefficient of expansion of these REFe$_{10}$V$_2$-compounds is less than the coefficient of expansion of REFe$_{10}$T$_2$-compounds, wherein T is chosen from the set of the elements Si, Ti, Cr, Mo and W.

The invention will now be described in greater detail with reference to embodiment and the accompanying drawing, the following A casting of the composition LuFe$_{10}$V$_2$ is used as the target during vapour deposition of this compound onto a substrate. Magnetron sputtering is affected in vacuum (pressure less than $10^{-5}$ Torr), wherein during 15 min. at a substrate temperature of 250° C. a thin magnetic, metallic layer having a thickness of 2$\mu$ is formed on that substrate. From FIG. 1, in which the thermal expansion of said LuFe$_{10}$V$_2$ is illustrated versus temperature, it can be derived that the mean thermal coefficient of expansion in the temperature range from 0°–200° C. is less than $1.5 \times 10^{-6}$.

Figure 2:
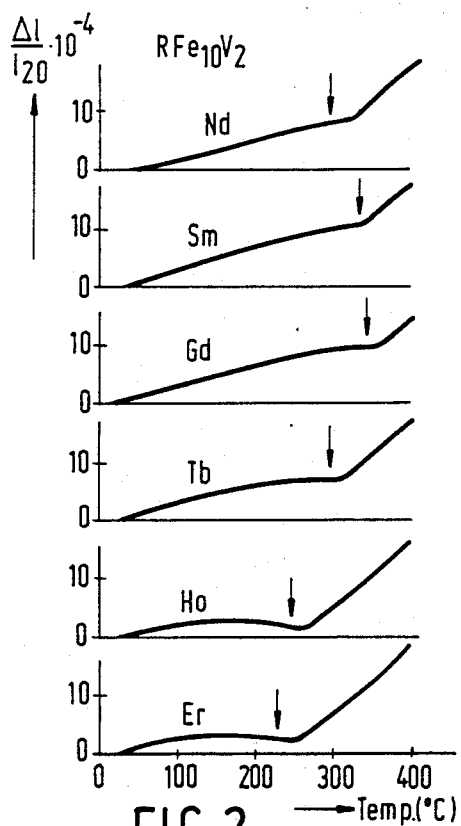
Figure 3:
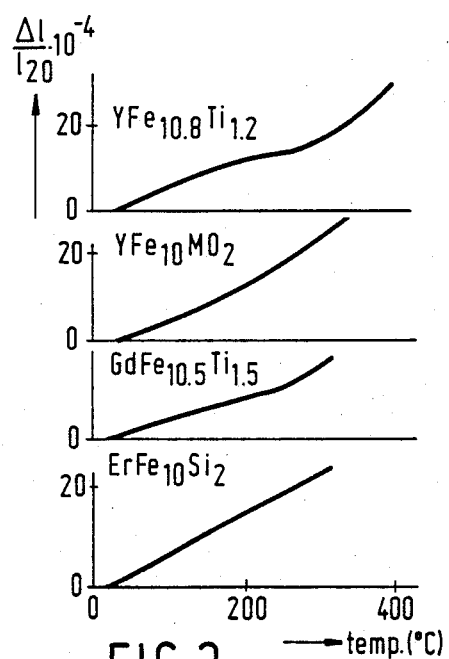

It should be noted that the compounds shown in FIGS. 2 and 3 were produced in a similar method as the method described in the embodiment. Also these compounds have a low thermal coefficient of expansion.

What is claimed is:

1. A method of producing thin layers of a magnetic, metallic material having a low thermal coefficient of expansion on a substrate, characterized in that the layers have a hard magnetic, stable intermetallic component with a tetragonal crystal structure of the ThMn$_{12}$-type, and that the magnetic, metallic material, the composition of which is defined by the formula REFe$_{12-x}$T$_x$, wherein RE is an element selected from the group consisting of Nd, Sm, Gd, Tb, Dy, Ho, Er, Tm, Lu and Y, wherein T is an element selected from the groups consisting of Si, Ti, V, Cr, Mo and W, and wherein $1 < x4$, is applied by means of a sputter deposition technique from the vapor phase.

2. A method as claimed in claim 1, characterized in that the composition of the magnetic, metallic material is defined by the formula $REFe_{10}V_2$, wherein RE is an element chosen from the set formed by Nd, Sm, Gd, Tb, Dy, Ho, Er, Tm, Lu and Y.

3. A method as claimed in claim 1, characterized in that during deposition the substrate is heated to a temperature of over 600° C.

* * * * *